United States Patent
Sata et al.

(10) Patent No.: US 11,086,546 B1
(45) Date of Patent: Aug. 10, 2021

(54) PRESERVE WRITE FOR SOLID-STATE DRIVES

(71) Applicant: Microsoft Technology Licensing, LLC, Redmond, WA (US)

(72) Inventors: Vamsi Sata, San Diego, CA (US); Dillip Kumar Dash, San Diego, CA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 16/746,349

(22) Filed: Jan. 17, 2020

(51) Int. Cl.
  *G11C 16/10* (2006.01)
  *G06F 3/06* (2006.01)
  *G11C 16/34* (2006.01)
  *G11C 16/04* (2006.01)

(52) U.S. Cl.
  CPC .......... *G06F 3/0647* (2013.01); *G06F 3/0619* (2013.01); *G06F 3/0659* (2013.01); *G06F 3/0679* (2013.01); *G11C 16/10* (2013.01); *G11C 16/349* (2013.01); *G11C 16/0483* (2013.01)

(58) Field of Classification Search
  CPC .... G06F 3/0647; G06F 3/0679; G06F 3/0619; G06F 3/0659; G11C 16/10; G11C 16/0483
  See application file for complete search history.

(56) References Cited

U.S. PATENT DOCUMENTS

| | | | |
|---|---|---|---|
| 9,940,039 B2 | 4/2018 | Duzly et al. | |
| 10,430,302 B2* | 10/2019 | Oruganti | G06F 3/0683 |
| 2008/0315932 A1* | 12/2008 | Tower | G11C 11/412 |
| | | | 327/202 |
| 2015/0135023 A1* | 5/2015 | Mekhanik | G11C 16/3427 |
| | | | 714/704 |
| 2016/0342347 A1* | 11/2016 | Duzly | G06F 3/064 |
| 2017/0168891 A1 | 6/2017 | Park | |

OTHER PUBLICATIONS

Ghose, et al., "Errors in Flash-Memory-Based Solid-State Drives: Analysis, Mitigation, and Recovery", In Repository of arXiv:1711 11427v2, Jan. 5, 2018, 86 Pages.
"International Search Report & Written Opinion issued in PCT Application No. PCT/US20/062471", dated Apr. 1, 2021, 13 Pages.

* cited by examiner

*Primary Examiner* — Jay W. Radke

(57) ABSTRACT

Systems, methods, and software are disclosed herein that enhance data storage operations. In various implementations, a preserve write process identifies one or more regions of the solid-state memory components that qualify to be relocated prior to a data storage device entering a data retention state. Prior to the data retention state, the process changes one or more values, of one or more write settings, to one or more new values. With the write settings changed to the one or more new values, the process relocates data from the one or more regions to one or more new regions. After having relocated the data, the process returns the one or more new values, of the one or more write settings, to one or more earlier values.

20 Claims, 10 Drawing Sheets

PRESERVE WRITE FOR SOLID-STATE DRIVES

TECHNICAL FIELD

Aspects of the disclosure are related to the field of computing hardware and software and in particular to data storage devices, systems, and sub-systems.

TECHNICAL BACKGROUND

Solid-state drives (SSDs) have become ubiquitous in the modern computing world. Employed in a range of computing devices from mobile phones to servers, solid-state drives (and their hybrid relatives) provide increasingly fast and reliable storage that make them popular for all types of computing workloads.

A representative solid-state drive includes a set of memory devices for storing data persistently, and a controller that controls the flow of data to and from the memory devices and on and off the drive. The memory devices each include one or more dies divided logically into blocks. The blocks on a given die are grouped together in planes and comprise a matrix of strings and pages. In turn, the strings and pages are comprised of individual cells.

A single cell stores a charge that, depending on its value, represents a certain state. A cell can thus be programmed (or erased) by charging (or not charging) the cell to varying degrees, depending on the type of cell. Unfortunately, cells wear out over time and have a tendency to lose charge during data retention periods (e.g. powered off). Elevated temperatures and shrinking sizes exacerbate charge loss, which becomes worse toward the end of SSD life.

Charge loss due to data retention causes voltage distributions to shift to the left and results in increased failures and bit error rates. Charge loss due to data retention also increases read-retry rates and error correction rates.

If charge loss during data retention is not accounted for, quality of service suffers due to the increased retry rates. That is, increased retry rates mean that the drive slows down. An increase in uncorrectable errors will also slow down the drive because recovery mechanisms take longer to recover the data. Lastly, an increase in read failures will result in an increase in bad blocks, which in turn will reduce capacity of the drive.

Overview

Technology is disclosed herein that enhances the ability of solid-state and hybrid drives to mitigate charge loss due to data retention. In various implementations, a process—referred to herein as preserve write—identifies one or more regions of the solid-state memory components that qualify to be relocated prior to a data storage device entering a data retention state. Prior to the data retention state, the process changes one or more values, of one or more write settings, to one or more new values. With the write settings changed to the one or more new values, the process relocates data from the one or more regions to one or more new regions and returns write settings to one or more earlier values.

This overview is provided to introduce a selection of concepts in a simplified form that are further described below in the Technical Disclosure. It may be understood that this overview is not intended to identify key features or essential features of the claimed subject matter, nor is it intended to be used to limit the scope of the claimed subject matter.

BRIEF DESCRIPTION OF THE DRAWINGS

Many aspects of the disclosure may be better understood with reference to the following drawings. The components in the drawings are not necessarily to scale, emphasis instead being placed upon clearly illustrating the principles of the present disclosure. Moreover, like reference numerals in the drawings designate corresponding parts throughout the several views. While several implementations are described in connection with these drawings, the disclosure is not limited to the implementations disclosed herein. On the contrary, the intent is to cover all alternatives, modifications, and equivalents.

DETAILED DESCRIPTION

Figure 1:
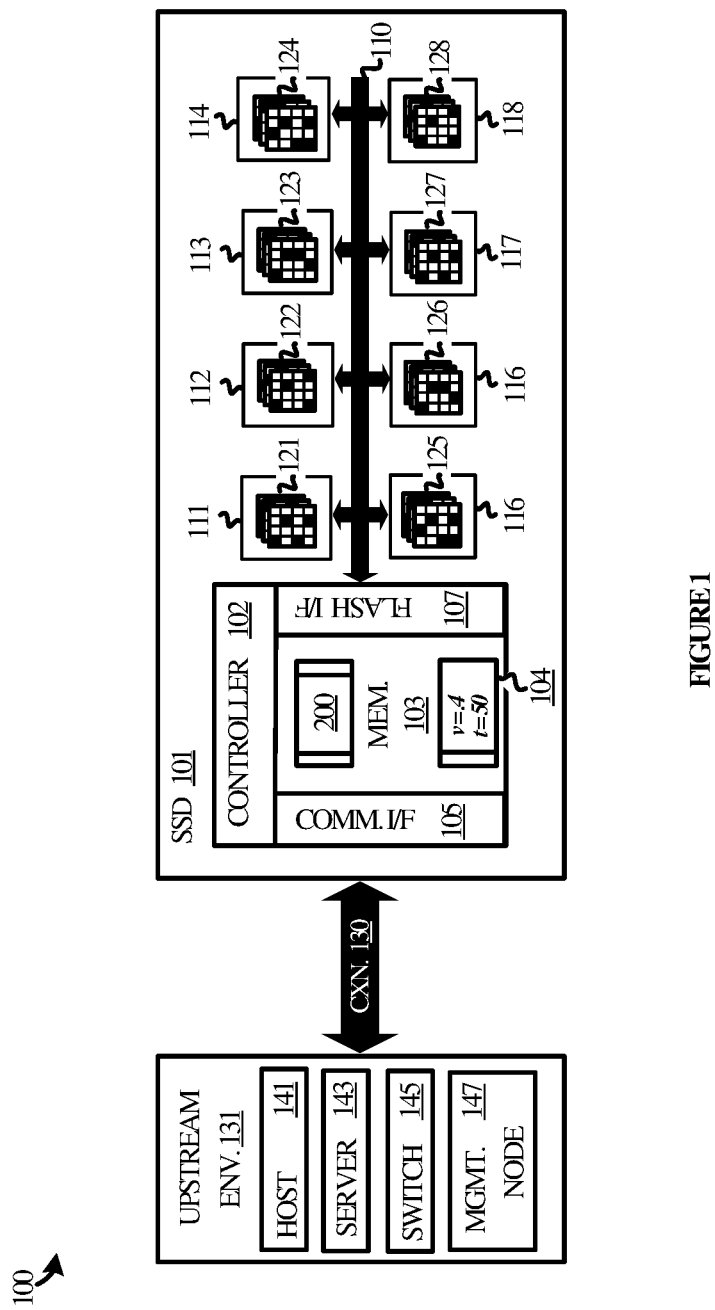
FIG. 1 illustrates an operational environment in an implementation of preserve write technology for solid-state memory devices.

Technology disclosed herein relates to systems and methods for enhancing the ability of data storage devices to mitigate the effects of charge loss due to data retention. In various implementations, a data storage device comprises solid-state memory components and a controller that governs read/write operations with respect to the components. Under normal operating conditions, the controller writes data to the memory components in accordance with settings in firmware that specify values for the write process such as voltage and timing. The controller monitors for bad blocks and, when they are encountered, relocates their data to new blocks with the write settings configured the same.

The data on the drive is thus protected from grown or manufactured defects but remains at risk due to charge loss during data retention periods such as when a drive is powered off for an extended period of time. When a drive returns from a data retention state, at least some of the blocks will have been rendered unreadable due to charge loss, regardless of whether the blocks were denoted as defective (and moved) or healthy prior to the period of data retention.

A preserve write process disclosed herein mitigates the risk of charge loss by relocating data from at-risk blocks to new blocks using new values for the write settings that increase their ability to withstand charge loss. Such an advance preserves the capacity of the drive for longer and prevents the drive from slowing down prematurely. The write settings may be returned to their earlier values such that subsequent writes happen in accordance with the earlier values, thereby conserving power relative to the power consumption profile of the preserve write settings. The write settings may be returned to their earlier values prior to the onset of the data retention period in some implementations so that normal relocations can proceed. In other instances, the write settings may be reset upon the drive exiting the data retention state.

The preserve write technology as disclosed herein may be implemented on a drive entirely in hardware, entirely in software (including firmware, resident software, microcode, etc.), or as a combination of hardware and software. Alternatively, preserve write may be implemented on a host or a server, or distributed between or amongst a combination of drive, host, and server.

In various implementations, a data storage device comprises solid-state memory components and a controller operatively coupled with the solid-state memory components. The controller identifies one or more regions, of the solid-state memory components, that qualify to be relocated prior to the data storage device entering a data retention state. Prior to the data retention state, the controller changes one or more values of one or more write settings to one or more new values. With the one or more write settings changed to the one or more new values, the controller relocates data from the one or more regions to one or more new regions. The write settings may be returned to their earlier values prior to the onset of the data retention period or after exiting the data retention state.

Examples of the one or more regions include blocks, pages, cells, and the like. The one or more write settings may include a voltage setting, for example, while the one or more earlier values may comprise an earlier voltage value. The one or more new values may comprise a new voltage value greater than the earlier voltage value. To relocate the data from the one or more regions to one or more new regions, the controller reads the data from one or more blocks and writes the data to one or more new blocks with the voltage setting changed to the new voltage value.

In some implementations, to identify the one or more regions of the solid-state memory components that qualify to be relocated, the controller determines that one or more error metrics associated with each of the one or more regions satisfy one or more retention criteria. The one or more retention criteria may comprise a failed bit count in excess of an error threshold, wherein the one or more error metrics comprise the failed bit count. In some scenarios, the one or more retention criteria may also include an idle time less than an idle threshold, wherein the one or more error metrics comprise the idle time. The error threshold may be a value greater than a regular error threshold used during regular operations to identify regions of the solid-state memory components that qualify to be relocated with the voltage setting unchanged.

An example of the data retention state is a powered off state and the controller may, in some cases, receive a management command from a host system for the data storage device to enter the data retention state. Such a command or instruction prompts the controller to relocate qualified blocks using the aforementioned preserve write settings.

Referring now to the drawings, FIG. 1 illustrates operational environment 100 in an implementation. Operational environment 100 includes solid-state drive 101 and upstream environment 131. Solid-state drive 101 communicates with upstream environment 131 over connection 130. Solid-state drive 101 is representative of any data storage device (including hybrid solid-state/hard-disk drives) that has non-volatile, solid-state memory devices on which to store data persistently, referred to herein as flash memory. Upstream environment 131 is representative of any one or more devices, systems, or sub-systems off-drive and with which solid-state drive 101 may communicate. Examples include hosts, servers, switches, and management nodes, represented by host 141, server 143, switch 145, and management node 147.

Solid-state drive 101 includes controller 102 and flash devices 111-118. Controller 102 is comprised of one or more processors such as a central processing unit (CPU)/reduced instruction set computer (RISC) processor, field programmable gate-array (FPGA) integrated circuits, or application-specific integrated circuits (ASIC). Controller 102 also includes memory 103, communication interface 105, and flash interface 107. Memory 103 may include one or more of volatile and non-volatile memory, such as dynamic random-access memory (DRAM), static random-access memory (SRAM), read-only memory (ROM), and flash memory. In addition, controller 102 may include one or more other functional blocks that are not shown for purposes of clarity. Examples include—but are not limited to—an error correction engine, a defect management block, a wear leveling block, an encryption/decryption block, and a direct memory access (DMA) controller.

Flash devices 111-118 each include a set of dies, represented by die groups 121-128 respectively. Each die group comprises one or more dies divided into blocks of cells that can be programmed by controller 102 to persistently store data. Controller 102 connects to flash devices 111-118 via flash interface 107 over bus 110 and communicates with one or more elements of upstream environment 131 via communication interface 105 over connection 130. Communication interface 105 and flash interface 107 may each be implemented in hardware, software, firmware, or a combination thereof.

Connection 130 is representative of one or more physical and/or logical connections for connecting solid-state drive 101 with one or more elements of upstream environment 131 in accordance with one or more suitable protocols. Examples of such protocols include, but are not limited to, serial attached storage (SAS), serial advanced technology attachment (SATA), universal serial bus (USB), peripheral component interconnect express (PCIe), non-volatile memory express (NVMe), Ethernet, and transmission control protocol/internet protocol (TCP/IP), as well as any combination and/or variation thereof.

Memory 103 includes write settings 104, examples of which include—but are not limited to—voltage and time. Controller 102 employs an implementation of a preserve write process, represented by preserve write process 200, to enhance its robustness in the face of charge loss due to data retention by modifying one or more of the write settings 104.

Figure 2:
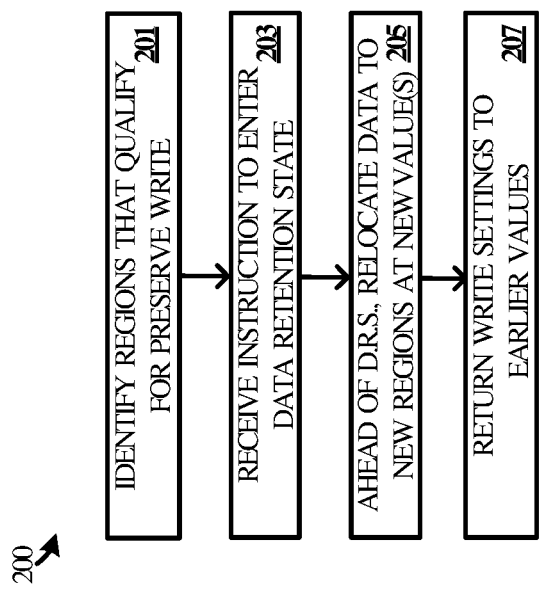
FIG. 2 illustrates a preserve write process in an implementation.

Preserve write process 200 may be implemented in hardware, firmware, software, or any combination thereof. For instance, preserve write process 200 may be implemented in the circuitry of one or more ASICs, code stored in ROM that is loaded onto FPGAs upon power-up, or in program instructions loaded from non-volatile memory into RAM and executed by one or more processors. A storage controller configured in accordance with preserve write process 200 (e.g. controller 102) operates as follows, referring parenthetically to the steps in FIG. 2.

To begin, the controller identifies regions of storage that qualify for preserve write protection (step 201). Examples of storage regions include blocks, planes, pages, strings, and cells. Whether a given region qualifies for preserve write protection may depend on one or more characteristics such as error rate of the region and whether the error rate meets or exceeds a threshold error rate.

The controller identifies the qualifying regions in anticipation of entering a data retention state, at which time the controller receives an instruction to enter the data retention state (step 203). The instruction may originate from a host, a server, a management node on a host, a server, or in the cloud, or it may originate internally with respect to the drive in which the controller resides.

Prior to entering the data retention state, the controller proceeds to relocate the data in the qualified regions to new regions using new values for the write settings involved in the relocation (step 205). The new values are set such that the data in their new locations will be able to withstand charge loss during the data retention period to a greater degree than had the data remained in its original locations, or had the data been relocated with the write settings configured with their normal values. Once the data has been relocated, the drive returns the values of the write settings to their earlier values (step 207). This may occur prior to the data retention period or after. In some implementations, the values are restored from ROM, flash, or elsewhere, allowing the drive to operate normally and to conserve resources relative to its power profile under the preserve write values.

Figure 3:
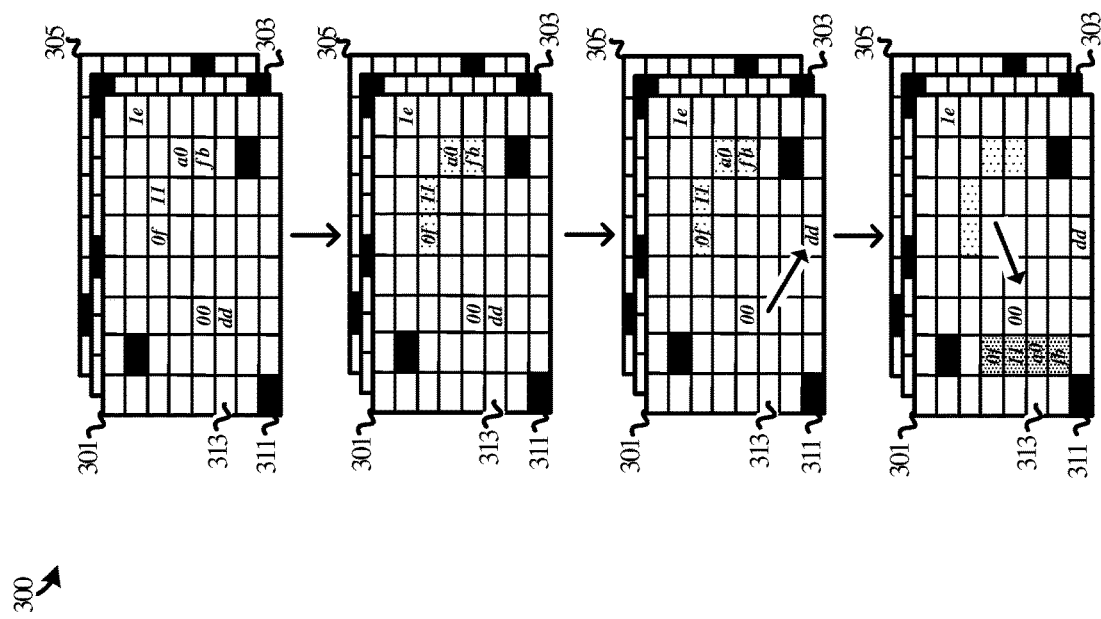
FIG. 3 illustrates an operational scenario in an implementation.

FIG. 3 illustrates operational scenario 300 in a representative example of preserve write process 200. Operational scenario 300 depicts several dies that transition through various states. The dies include die 301, die 303, and die 305. Dies 301-305 are representative of a set of dies on a flash memory device, for example. The dies include blocks and the blocks are either healthy (e.g. block 113) or defective (e.g. block 111) as noted by a solid/black fill pattern. The health blocks may store data, represented by brief strings of hexadecimal characters in several of the cells. From left to right and top to bottom, the data in this scenario reads: 00, dd, 0f, 11, a0, fb, and 1e.

A controller configured in accordance with preserve write process 200 would scan the blocks of each die to identify those that qualify to be relocated under preserve write conditions. The controller may scan for qualified blocks periodically, on an ad-hoc basis, on a scheduled basis, in response to triggers, or on some other basis. For instance, the controller may perform the scan in response to an instruction to power down, a notification of an upcoming power-off state, or the like. Alternatively, the controller may perform the scan on a regular or semi-regular basis to have a set of qualified blocks already identified prior to an instruction or notification with respect to an upcoming transition to a data retention state.

The scan identifies qualified blocks based on their error rate relative to a threshold error rate. Blocks with an error rate in excess of the threshold qualify to be relocated under preserve write settings or conditions because they are more likely than other, non-qualified blocks to suffer from charge loss during periods of data retention. Relocating the data from the qualified blocks to new blocks using the preserve write settings not only reduces the loss of data due to charge loss, but may also reduce the error rates associated with the new blocks since the data will have been written more strongly to them under the preserve write settings.

In operational scenario 300, it is assumed for exemplary purposes that the scan identifies four blocks as qualified for preserve write as indicated by the shading of the blocks storing the following strings: 0f, 11, a0, fb. However, before the relocation for preserve write purposes occurs, it is also assumed for exemplary purposes that a normal relocation occurs with respect to the block storing "dd." That is, the identified block is flagged as approaching or having reached a defective state and its data is relocated under normal write settings to protect the data. To illustrate the relocation, the data in the affected blocks is moved down and to the right in die 301, although the data may be moved to one or more other dies instead of, or in addition to, die 301.

Subsequent to the normal relocation operation, it is further assumed that the drive is instructed to power down or otherwise transition to a data retention state. The controller responsively accesses a list, table, or other such data structure that holds the identity of the qualified blocks and proceeds to relocate their data to new blocks under preserve write settings. For instance, the data may be written to the new locations at a new voltage that exceeds the voltage applied during the normal relocation.

Figure 4:
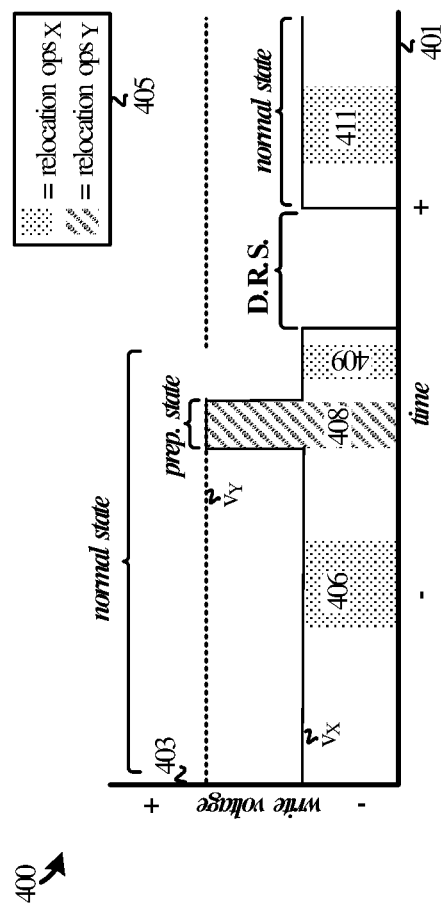
FIG. 4 illustrates a graph characterizing various aspects of preserve write.

FIG. 4 illustrates a graph 400 that depicts how write settings under preserve write change over time and with respect to drive state. Graph 400 includes an x-xis 401 and y-axis 403. X-axis 401 depicts time increasing from left to right, while y-axis 403 depicts write voltage increasing laterally. Legend 405 depicts pattern coding that corresponds to periods of relocation operations. Areas in graph 400 shown with shading represent relocation operations conducted under normal write settings, whereas areas shown with a striped pattern correspond to relocation operations conducted under preserve write settings.

For example, area 406 represents a period of time during which a controller (e.g. controller 102) configured in accordance with preserve write process 200 conducts write operations—including relocation operations—while the drive is in a normal state. The controller writes data to blocks with the write voltage set to V(X). In the context of relocation operations, the controller reads data from at-risk blocks and writes the data to new blocks at V(X). The controller also writes new data to blocks with the voltage set to V(X). (It may be appreciated that VX is not fixed but rather is a starting point from which voltage may be increased incrementally during retries.)

In the background, the controller identifies blocks that are at-risk with respect to charge loss. Area 408 in graph 400 represents a period of time during which the controller conducts relocation operations in a preparatory state. That is, at or around the time a notification or instruction is received to transition to a data retention state, the controller first enters a preparatory state during which it changes one or more of the write settings. For instance, controller sets the write voltage to V(Y), which is greater than V(X) to mitigate the impact of charge loss. During the preparatory state, which may be considered an initial stage of the data retention state, the controller conducts relocation operations with the new voltage value in effect. The controller reads data from the blocks identified as at-risk of charge loss and writes the data to new blocks at V(Y). The data in the old blocks may be erased in some scenarios, marked as erased, or both.

Prior to entering a data retention state, the drive may exit the preparatory state and return to the normal state. Under such circumstances, the drive returns or resets the values of the write settings to their earlier values such that relocation operations can continue under the old settings. For example, the write voltage is once again set to V(X). Accordingly, relocation operations conducted while in the normal state, as depicted by area 409, are conducted with the write settings restored to their initial values.

Whether immediately after the preparatory state or after a subsequent period of normal operation, the drive then enters a data retention state (e.g. powered off), during which the cells in the various blocks may lose charge. When the drive returns to a normal state upon powering-on, the write settings are set to their earlier values, either having been reset prior to powering down or resetting upon powering up. For example, relocation operations conducted while in the normal state, as depicted by area 411, are conducted with the write voltage restored to its earlier value, V(X).

Figure 5:
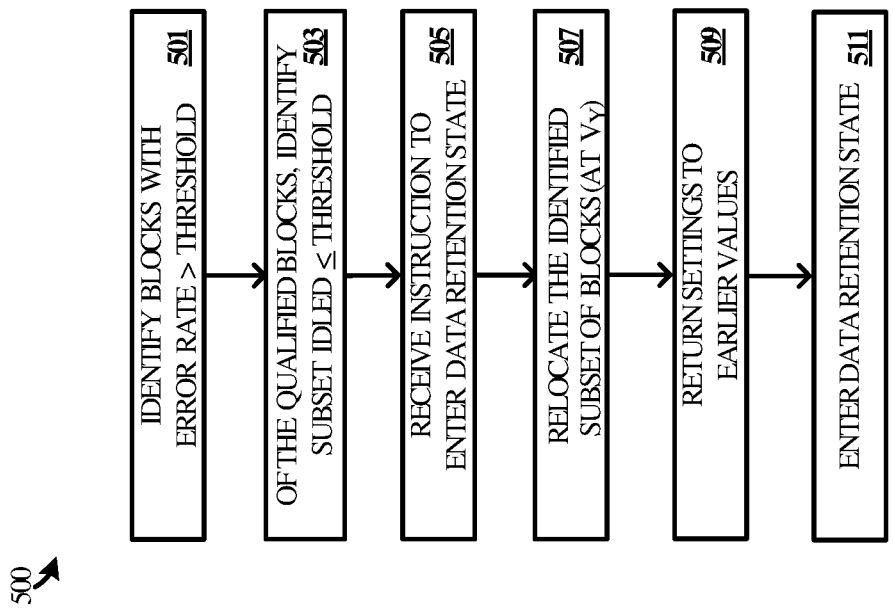
FIG. 5 illustrates another preserve write process in an implementation.

FIG. 5 illustrates another preserve write process in an implementation, represented by preserve write process 500. A controller (e.g. controller 102) may employ preserve write process 500 to mitigate the effects of charge loss due to data retention. Preserve write process 500 may be implemented in hardware, firmware, software, or any combination thereof. For instance, preserve write process 500 may be implemented in the circuitry of one or more ASICs, code stored in ROM that is loaded onto FPGAs upon power-up, or in program instructions loaded from non-volatile memory into RAM and executed by one or more processors. A storage controller configured in accordance with preserve write process 500 (e.g. controller 102) operates as follows, referring parenthetically to the steps in FIG. 5.

To begin, the controller identifies blocks of non-volatile media having error rates greater than or equal to a threshold error rate (step 501). Examples of the error rate include a bit error rate, a failed block count, or the like. From the set of qualified blocks, the controller identifies a subset of blocks that have been idle less than (or equal to) a threshold idle time (step 503). The idle time represents an amount of time that has elapsed since a given block was subject to a write operation. A block that has not been programmed recently and has been sitting idle for less than (or equal to) the threshold period of time would be included in the subset of qualified blocks.

The controller identifies the subset of qualified blocks in planning or preparation for the onset of a data retention state, at which time the controller receives an instruction to enter the data retention state (step 505). The instruction may originate from a host, a server, a management node on a host, a server, or in the cloud, or it may originate internally with respect to the drive in which the controller resides. The instruction may be an NVMe command in some examples.

Prior to entering the data retention state, the controller proceeds to relocate the data in the subset of qualified regions to new regions and using new values for the write settings involved in the relocation (step 507). Specifically, the controller reads the data from the blocks and writes the data to new blocks at a new voltage V(Y) that is greater than the voltage setting during normal write operations in order to withstand charge loss.

The drive, governed by the controller returns to a normal operating state however briefly and, in so doing, returns the one or more values of the write settings to their earlier values (step 509). This may happen when, for example, the values are restored from ROM, flash, or elsewhere, allowing the drive to operate normally and to conserve resources relative to its power profile under the previous (or new) values.

Once the relocation process has completed and the write settings have been restored, the drive is able to enter the data retention state (step 511). Upon powering on again, the write settings will have been restored to their earlier values and relocation operations (and other write operations) can commence under the normal values for the write settings.

Figure 6:
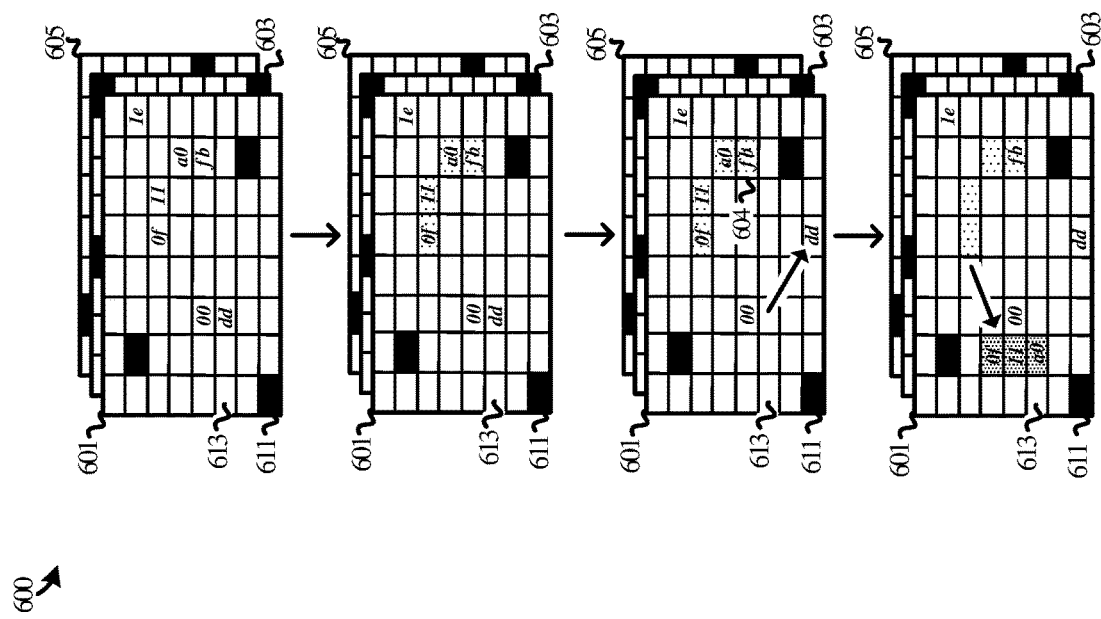
FIG. 6 illustrates an operational scenario in an implementation.

FIG. 6 illustrates operational scenario 600 in a representative example of preserve write process 500. Operational scenario 600 depicts several dies that transition through various states. The dies include die 601, die 603, and die 605. Dies 601-605 are representative of a set of dies on a flash memory device, for example. The dies include blocks and the blocks are either healthy (e.g. block 613) or defective (e.g. block 611) as noted by a solid/black fill pattern. The healthy blocks may store data, represented by brief strings of hexadecimal characters in several of the cells. From left to right and top to bottom, the data in this scenario reads: 00, dd, 0f, 11, a0, fb, and 1e.

A controller configured in accordance with preserve write process 500 scans the blocks of each die to identify those that qualify to be relocated under preserve write conditions. The controller may scan for qualified blocks periodically, on an ad-hoc basis, on a scheduled basis, in response to triggers, or on some other basis. For instance, the controller may perform the scan in response to an instruction to power down, a notification of an upcoming power-off state, or the like. Alternatively, the controller may perform the scan on a regular or semi-regular basis to have a set of qualified blocks already identified prior to an instruction or notification with respect to an upcoming transition to a data retention state.

The scan identifies qualified blocks based on their error rate relative to a threshold error rate and their idle time relative to an idle threshold. Blocks with an error rate in excess of the first threshold and less than the second threshold qualify to be relocated under preserve write settings or conditions because they are more likely than other, non-qualified blocks to suffer from charge loss during periods of data retention. Relocating the data from the qualified blocks to new blocks using the preserve write settings not only reduces the loss of data due to charge loss, but will also reduce the error rates associated with the new blocks since the data will have been written more strongly to them under the preserve write settings.

In operational scenario 600, it is assumed for exemplary purposes that the scan identifies four blocks as qualified for preserve write as indicated by the shading of the blocks storing the following: 0f, 11, a0, fb. However, one of the blocks having the value "fb" stored therein is assumed for exemplary purposes to have an idle time that is greater than the idle threshold. That block is thus excluded from the subset that is relocated prior to data retention. As such, three of four blocks are relocated, but the one is not.

Before the relocation for preserve write purposes occurs, it is also assumed for exemplary purposes that a normal relocation occurs with respect to the block storing "dd." That is, the identified block is flagged as approaching or having reached a defective state and its data is relocated under normal write settings to protect the data. To illustrate the relocation, the data in the affected blocks is moved down and to the right in die 601, although the data may be moved to one or more other dies instead of, or in addition to, die 601.

Subsequent to the normal relocation operation, it is further assumed that the drive is instructed to power down or otherwise transition to a data retention state. The controller responsively accesses a list, table, or other such data structure that holds the identity of the qualified blocks and proceeds to relocate their data to new blocks under preserve write settings. For instance, the data may be written to the new locations at a voltage that exceeds the voltage applied during the normal relocation.

Figure 7:
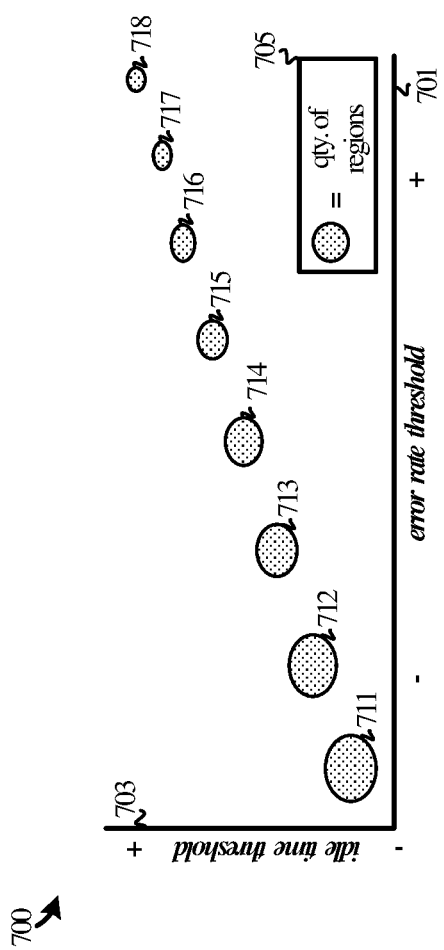
FIG. 7 illustrates a graph further characterizing various aspects of preserve write.

FIG. 7 illustrates a graph 700 that depicts the relationship between error rates and idle times with respect to the quantity of regions that qualify for preserve write treatment. Graph 700 includes an x-axis 701 pertaining to a threshold error rate (increasing from left to right) and a y-axis pertaining to a threshold idle time (decreasing laterally). Legend 705 indicates that each symbol, of symbols 711-718, represents a representative count or quantity of regions that qualify for preserve write relocation at a particular combination of error rate threshold and idle time threshold. Their varying sizes represent relative differences in quantities.

For example, symbol 711 is larger than symbol 712, which is larger than symbol 713, and so on. In other words, the sizes of symbols 711-718 decrease as the error rate threshold increases and the idle time threshold decreases. Graph 700 thus represents that as the thresholds become more restrictive, the criteria for being relocated becomes more selective and fewer quantities of blocks qualify for preserve write relocation. Such a relationship reduces or mitigates the likelihood that data is relocated unnecessarily or wastefully.

Figure 8:
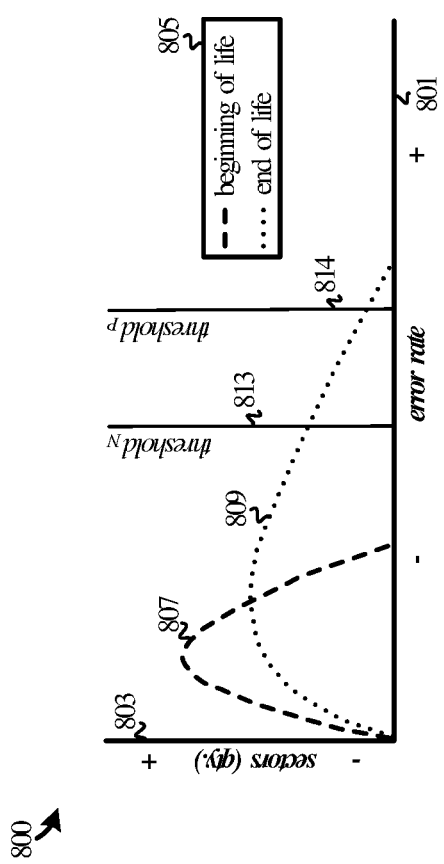
FIG. 8 illustrates a graph further characterizing various aspects of preserve write.

FIG. 8 illustrates a graph 800 that depicts the relationship between error rates and sectors over the life of a drive, as well as their interaction with a normal relocation and a preserve write threshold. Graph 800 includes an a-axis pertaining to error rates, increasing from left to right. The y-axis 803 represents a quantity of sectors (e.g. blocks). Legend 805 indicates that curve 807 pertains to the error distribution across sectors of a drive at the beginning of life, whereas curve 809 pertains to the error distribution of a drive at the end of life. Threshold (N) 813 represents an error threshold at which blocks would be relocated under normal write settings, whereas threshold (P) 814 represents an error threshold (or combination of error threshold and idle threshold) at which blocks would be relocated under preserve write settings.

From curve 807, it may be appreciated that, early in the life of a drive, little to no blocks would qualify for either type of relocation. In contrast, curve 809 illustrates that, toward the end of the life of a drive, some of the blocks would qualify for normal relocation and still others would qualify for preserve write relocation. Taken together, the relative shape of curve 807 compared to curve 809 indicates a broader distribution of errors over a drive at the end of life relative to the beginning of life. That is, a preserve write process as disclosed herein will have the effect of extending the life of a drive since the data in weaker cells will be relocated under stronger settings ahead of a data retention period.

Figure 9:
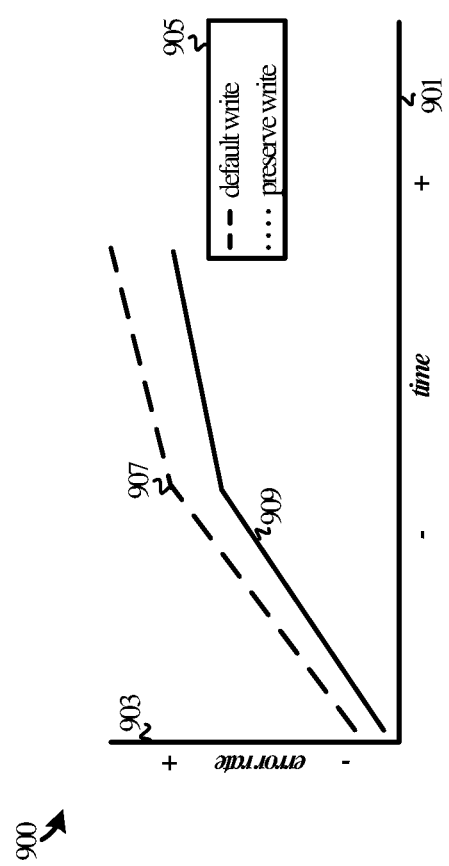
FIG. 9 illustrates a graph further characterizing various aspects of preserve write.

FIG. 9 illustrates graph 900 to demonstrate the technical effects discussed above. Graph 900 includes an x-axis indicative of time and a y-axis indicative of error rates. Legend 905 explains that curve 907 relates to the error profile of a drive utilizing only default write processes, whereas curve 909 relates to the error profile of a drive employing preserve write processes as described herein.

For example, the error rate of curve 907 gradually increased in time at a faster rate than the error rate of curve 909. Toward the end of life of both drives, the error rate on the drive employing preserve write is less than that of the drive lacking preserve write. In addition, the total area under curve 909 is less than the area under curve 907, indicating that the total number of errors is also less. The drive associated with curve 909 will therefore have more capacity remaining at the end of the life of the other drive, implying that the life of the drive under preserve write has been extended.

It may be appreciated from the foregoing discussion that NAND-type flash memories intrinsically experience a charge loss which results in the weakening of data integrity. This phenomenon, called "charge loss during data retention", is exacerbated by NAND aging, elevated temperatures, and shrinking NAND process nodes/generations (smaller nodes are more sensitive to data retention charge loss). The charge loss due to data retention results in the shifting of NAND Vt distributions to the left, elevated failure rates/increased bit error rates, and increased read-retry rate/ECC correction rates.

The impact of this phenomenon on the drive is significant if not countered. If the data retention charge loss is not accounted for, it will have a significant impact on quality of service (QOS) because of the increased retry rate. It will also increase latency penalties (uncorrectable errors with read retry will result in the drive resorting to recovery mechanisms that take longer to recover the data) and cause read failures that will result in increased bad blocks. This, in turn, will reduce the capacity of a drive.

NAND vendors typically guarantee a data retention specification that will ensure that a drive is recoverable after a certain time on-shelf in a powered off state. The specifications are typically 3 months at 40 C for enterprise grade NAND and 1 year at 55 C for consumer grade NAND. However, these specifications involve a significant amount of read-retry upon power-up after the off-shelf retention and the power-up takes a very long time. This results in an increased boot time and might result in a reduced capacity due to the increased bad block rate.

Existing mechanisms to counter charge loss include to carefully program and erase, i.e. to program and erase with moderate starting voltages and increments. This approach reduces the wear on the NAND cells and results in a slower rate of charge loss during DR. Another approach is to have NAND age/wear-based threshold conditions. This approach tweaks the threshold settings according to the estimated NAND age or wear, resulting in an improved error rate. Unfortunately, such conventional approaches result in the slowing down of program and erase operations, which results in decreased write throughput on an SSD. The slower/longer program and erase operations also have to be suspended more often to accommodate the high priority operations, which further impacts QOS. There is a potential power impact as well where the average power required to complete a program/erase operation is higher and will result in a need to reallocate the power budget on the SSD. Even the second conventional approach needs to maintain multiple tables to adjust the NAND parameters throughout the life cycle, which adds firmware complexity.

As disclosed herein, a preserve write methodology performs one write before a planned or ad-hoc off-shelf retention. The process relocates certain sectors with special settings during run-time retention. The preserve write process is applied to weaker blocks/pages and has special settings for program and erase operations that are used during the preserve operation. As such, the preserve write process has little to no impact on the regular operation of the SSD.

During the regular operation of an SSD, a preventive data relocation is performed to prevent potential uncorrectable errors. A bit error rate scan is performed on a drive after a designated time interval, which forms the basis for the relocation. An error threshold (Threshold 1) is specified for the algorithm and whenever the failed bit count (FBC) of a sector/region is greater than the error threshold, the blocks are moved to a new location. Towards the end of the SSD life, the percentage of sectors needing relocation increases significantly, which elevates background activity and impacts the QOS of the drive.

To address this problem, preserve write adds more margin to the data retention profile of a drive. In this proposed approach, another error threshold (Threshold 2) is specified for the preserve write. On the sectors/regions with FBC greater than Threshold 2, the data will be relocated with preserve write settings. This approach adds margin to the weakest regions on the drive and prevents the regular relocation rate from ballooning out of control. The proposed solution results in an improved performance on the SSD (especially towards the end of life).

Care will be taken to make sure that the sectors with FBC>Threshold 2 are also checked for the time a sector has been sitting cold, i.e. FBC>Threshold 2 and Idle time<Time threshold. This additional aspect ensures that the elevated FBC is due to weaker blocks/pages and not because of the excessive idle duration.

Figure 10:
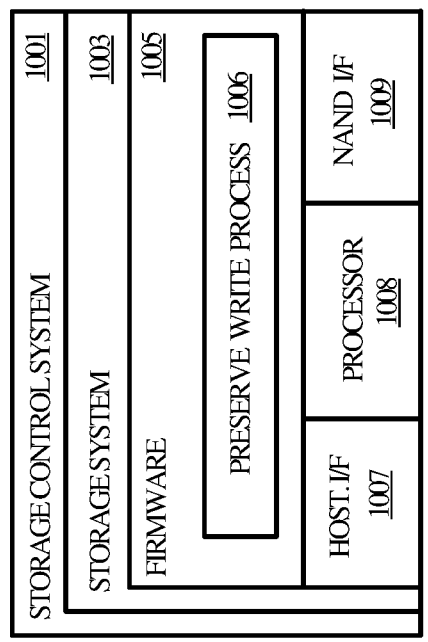
FIG. 10 illustrates a storage control system suitable for implementing the various operational environments, related scenarios, processes, and operational architectures discussed below with respect to the Figures.

FIG. 10 illustrates storage control system 1001 that is representative of any system or collection of systems from which the various data storage, redundancy data calculation, data redundancy structural arrangement selection, and storage media control operations can be directed. Any of the operational architectures, platforms, scenarios, and processes disclosed herein may be implemented using elements of storage control system 1001. In one implementation, storage control system 1001 is representative of at least a portion of controller 102 of FIG. 1.

Storage control system 1001 may be implemented as a single apparatus, system, or device or may be implemented in a distributed manner as multiple apparatuses, systems, or devices. Storage control system 1001 includes, but is not limited to, processor 1008, storage system 1003, host interface 1007, NAND interface 1009, and firmware 1005. Processor 1008 is operatively coupled with storage system 1003 and host interface 1007.

Processor 1008 loads and executes firmware 1005 from storage system 1003. Firmware 1005 includes preserve write process 1006, which is representative of the processes discussed with respect to the preceding Figures. When executed by processor 1008 to provide enhanced data retention capabilities, firmware 1005 directs processor 1008 to operate as described herein for at least the various processes, operational scenarios, and sequences discussed in the foregoing implementations. Storage control system 1001 may optionally include additional devices, features, or functionality not discussed for purposes of brevity.

Referring still to FIG. 10, processor 1008 may comprise a microprocessor and processing circuitry that retrieves and executes firmware 1005 from storage system 1003. Processor 1008 may be implemented within a single processing device, but may also be distributed across multiple processing devices, sub-systems, or specialized circuitry, that cooperate in executing program instructions and in performing the operations discussed herein. Examples of processor 1008 include general purpose central processing units, application specific processors, field programmable gate array devices, and logic devices, as well as any other type of processing device, combinations, or variations thereof.

Storage system 1003 may comprise any computer readable storage media readable by processor 1008 and capable of storing firmware 1005. Storage system 1003 may include volatile and nonvolatile, removable and non-removable media implemented in any method or technology for storage of information, such as computer readable instructions, data structures, program modules, or other data. Examples of storage media include random access memory (RAM), read only memory, flash memory, virtual memory and non-virtual memory, or any other suitable storage media. In no case is the computer readable storage media a propagated signal.

In addition to computer readable storage media, in some implementations storage system 1003 may also include computer readable communication media over which at least some of firmware 1005 may be communicated internally or externally. Storage system 1003 may be implemented as a single storage device but may also be implemented across multiple storage devices or sub-systems co-located or distributed relative to each other. Storage system 1003 may comprise additional elements, such as interface controllers, capable of communicating with processor 1008 or possibly other systems.

Firmware 1005 may be implemented in program instructions and among other functions may, when executed by processor 1008, direct processor 1008 to operate as described with respect to the various operational scenarios, sequences, and processes illustrated herein. For example, firmware 1005 may include program instructions for providing enhanced data retention capabilities, among other operations.

In particular, the program instructions may include various components or modules that cooperate or otherwise interact to carry out the various processes and operational scenarios described herein. The various components or modules may be embodied in compiled or interpreted instructions, or in some other variation or combination of instructions. The various components or modules may be executed in a synchronous or asynchronous manner, serially or in parallel, in a single threaded environment or multi-threaded, or in accordance with any other suitable execution paradigm, variation, or combination thereof.

Storage control system 1001 may include additional processes, programs, or components, such as operating system software or other application software, in addition to firmware 1005 and preserve write process 1006. Firmware 1005 may also comprise software or some other form of machine-readable processing instructions executable by processor 1008.

In general, firmware 1005 may, when loaded into processor 1008 and executed, transforms a suitable apparatus, system, or device (of which storage control system 1001 is representative) overall from a general-purpose computing system into a special-purpose computing system customized to facilitate data storage and retention. Encoding firmware 1005 on storage system 1003 may transform the physical structure of storage system 1003. The specific transformation of the physical structure may depend on various factors in different implementations of this description. Examples of such factors may include, but are not limited to, the technology used to implement the storage media of storage system 1003 and whether the computer-storage media are characterized as primary or secondary storage, as well as other factors. For example, if the computer readable storage media are implemented as semiconductor-based memory, firmware 1005 may transform the physical state of the semiconductor memory when the program instructions are encoded therein, such as by transforming the state of transistors, capacitors, or other discrete circuit elements constituting the semiconductor memory. Other transformations of physical media are possible without departing from the scope of the present description, with the foregoing examples provided only to facilitate the present discussion.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the disclosure. Those skilled in the art will also appreciate that the features described above may be combined in various ways to form multiple embodiments. As a result, the invention is not limited to the specific embodiments described above, but only by the claims and their equivalents.

What is claimed is:

1. A data storage device comprising:
   solid-state memory components; and
   a controller operatively coupled with the solid-state memory components and comprising one or more processors configured to at least:
      identify one or more regions, of the solid-state memory components, that qualify to be relocated prior to the data storage device entering a data retention state; and
      prior to the data retention state:
         change one or more values of one or more write settings to one or more new values;
         with the one or more write settings changed to the one or more new values, relocate data from the one or more regions to one or more new regions; and
         after relocating the data, return the one or more new values, of the one or more write settings, to one or more earlier values.

2. The data storage device of claim 1 wherein:
   each of the one or more regions comprises a block;
   the one or more write settings comprise a voltage setting;
   the one or more earlier values comprises an earlier voltage value;
   the one or more new values comprises a new voltage value greater than the earlier voltage value; and
   the controller, to relocate the data from the one or more regions to one or more new regions, reads the data from one or more blocks and writes the data to one or more new blocks with the voltage setting changed to the new voltage value.

3. The data storage device of claim 2 wherein, to identify the one or more regions of the solid-state memory components that qualify to be relocated, the controller determines that one or more error metrics associated with each of the one or more regions satisfy one or more retention criteria.

4. The data storage device of claim 3 wherein the one or more retention criteria comprise a failed bit count in excess of an error threshold and wherein the one or more error metrics comprise the failed bit count.

5. The data storage device of claim 4 wherein the one or more retention criteria further comprise an idle time less than an idle threshold and wherein the one or more error metrics further comprise the idle time.

6. The data storage device of claim 5 wherein the error threshold comprises a value greater than a regular error threshold used during regular operations to identify regions of the solid-state memory components that qualify to be relocated with the voltage setting unchanged.

7. The data storage device of claim 6 wherein the data retention state of the data storage device comprises a powered off state.

8. The data storage device of claim 7 wherein the controller is further configured to receive a management command from a host system for the data storage device to enter the data retention state.

9. A method for reducing charge loss on solid-state memory devices, the method comprising:
   identifying one or more regions of solid-state memory on a data storage device that qualify to be relocated prior to the data storage device entering a data retention state; and
   prior to the data retention state:
      changing one or more values of one or more write settings to one or more new values;
      with the one or more write settings changed to the one or more new values, relocating data from the one or more regions to one or more new regions; and
      after relocating the data, returning the one or more new values, of the one or more write settings, to one or more earlier values.

10. The method of claim 9 wherein:
    each of the one or more regions comprises a block;
    the write settings comprise a voltage setting;
    the one or more earlier values comprises an earlier voltage value;
    the one or more new values comprises a new voltage value greater than the earlier voltage value; and
    relocating the data from the one or more regions to one or more new regions comprises reading the data from one or more blocks and writing the data to one or more new blocks with the voltage setting changed to the new voltage value.

11. The method of claim 10 wherein identifying the one or more regions of the solid-state memory that qualify to be relocated comprises determining that one or more error metrics associated with each of the one or more regions satisfy one or more retention criteria.

12. The method of claim 11 wherein the one or more retention criteria comprise a failed bit count in excess of an error threshold and wherein the one or more error metrics comprise the failed bit count.

13. The method of claim 12 wherein the one or more retention criteria further comprise an idle time less than an idle threshold and wherein the one or more error metrics further comprise the idle time.

14. The method of claim 13 wherein the error threshold comprises a value greater than a regular error threshold used during regular operations to identify regions of the solid-state memory that qualify to be relocated with the voltage setting unchanged.

15. The method of claim 14 wherein the data retention state of the data storage device comprises a powered off state.

16. The method of claim 15 further comprising receiving, in the data storage device, a management command from a host for the data storage device to enter the data retention state.

17. A computing device comprising:
    a host system; and
    a data storage device comprising solid-state memory components and one or more processors configured to at least:
       identify one or more regions, of the solid-state memory components, that qualify to be relocated prior to the data storage device entering a data retention state; and
       prior to the data retention state:
          change one or more values of one or more write settings to one or more new values;
          with the one or more write settings changed to the one or more new values, relocate data from the one or more regions to one or more new regions; and
          after having relocated the data to the one or more new regions, return the one or more new values, of the one or more write settings, to one or more earlier values.

18. The computing device of claim 17 wherein, to identify the one or more regions of the solid-state memory components that qualify to be relocated, the one or more processors determine that one or more error metrics associated with each of the one or more regions satisfy one or more retention criteria.

19. The computing device of claim 18 wherein the one or more retention criteria comprise a failed bit count in excess of an error threshold and wherein the one or more error metrics comprise the failed bit count.

20. The computing device of claim 19 wherein the one or more retention criteria further comprise an idle time less than an idle threshold and wherein the one or more error metrics further comprise the idle time.

\* \* \* \* \*